United States Patent [19]

DelVecchio

[11] 3,978,379

[45] Aug. 31, 1976

[54] CORONA GENERATING DEVICE WITH AN IMPROVED CLEANING MECHANISM

[75] Inventor: George D. DelVecchio, North Rose, N.Y.

[73] Assignee: Xerox Corporation, Stamford, Conn.

[22] Filed: Nov. 20, 1974

[21] Appl. No.: 525,601

[52] U.S. Cl. ............................ 317/262 A; 250/324; 355/3 R; 51/392; 51/400; 51/DIG. 10

[51] Int. Cl.² .................... G03G 15/00; H01J 37/26

[58] Field of Search .............. 317/4, 262 A; 55/121; 250/324–326; 355/3; 51/400, 392, DIG. 10

[56] References Cited

UNITED STATES PATENTS

| | | | |
|---|---|---|---|
| 2,351,089 | 6/1944 | Abbey | 55/121 |
| 2,958,593 | 11/1960 | Hoover et al. | 51/400 UX |
| 3,842,273 | 10/1974 | Van Buskirk | 317/262 A |

FOREIGN PATENTS OR APPLICATIONS

| | | | |
|---|---|---|---|
| 2,302,212 | 1/1973 | Germany | 317/262 A |

OTHER PUBLICATIONS

"Corona Unit Cleaning Device," IBM Technical Disclosure Bulletin, W. F. Voit, Jr., vol. 11, No. 8, Jan. 1969.

*Primary Examiner*—R. N. Envall, Jr.
*Attorney, Agent, or Firm*—B. A. Chiama; Earl T. Reichert

[57] ABSTRACT

An improved corona generating device for an electrostatic reproduction machine having a photoreceptor has a discharge electrode, a conductive shield partially surrounding the electrode, and a cleaning member in contact with and mounted for movement along both the electrode and shield. The improvement lies (1) in the mechanism for moving the cleaning member along the device, this mechanism including a dielectric member located between the electrode and shield so as to increase the corona to the photoreceptor, and (2) in the cleaning member, this member including material impregnated with an abrasive.

4 Claims, 3 Drawing Figures

CORONA GENERATING DEVICE WITH AN IMPROVED CLEANING MECHANISM

BACKGROUND OF THE INVENTION

This invention relates generally to an improvement in an electrostatic reproduction machine, but more particularly to an improved corona generating device for such a machine.

In the practice of xerography as described in U.S. Pat. No. 2,297,691 to Chester F. Carlson, a xerographic surface comprising a layer of photoconductive insulating material affixed to a conductive backing is used to support electrostatic images. In the usual method of carrying out the process, the xerographic plate is electrostatically charged uniformly over its surface, and then exposed to a light pattern of the image being reproduced to thereby discharge the charge in the areas where light strikes the layer. The undischarged areas of the layer thus form an electrostatic charge pattern or electrostatic latent image in conformity with the configuration of the original pattern.

The latent electrostatic image is developed by contacting it with a finely divided electrostatically attractable material, such as a resinous powder. The powder is held in the image areas by the electrostatic fields on the layer. Where the field is greatest, the greatest amount of material is deposited, and where the field is least, little or no material is deposited. Thus, a powder image is produced in conformity with the image of the original being produced. The powder image is subsequently transferred to a sheet of paper or other transfer member, and suitably affixed thereto to form a permanent copy.

The latest concept for electrostatic reproduction, machines utilizes high speed flash exposure of the document, and a moving photoconductive material in the form of an endless belt which is continuously charged. Additionally, such reproduction machines are provided with a developing system which supplies toner particles in relatively large quantities for solid area coverage, such as a magnetic brush developing apparatus. Thus, after the belt passes the magnetic brush assembly, for example, a xerographic powder image is formed on the belt which corresponds to the electrostatic latent image. This powder image is then transferred to a support surface (e.g., a sheet of paper) to which it is fused by a fusing assembly whereby the powder image is caused to adhere to the support surface permanently.

The latest electrostatic reproduction machines are high speed machines which print copies at a rate substantially in excess of any previous electrostatic reproduction machines, and are intended to compete with other types of printing machines, e.g., offset printing machines. Because of this, it is desired that the quality of the copies made, be extremely high. Important to high quality copies are effective corona generating devices. Numerous corona discharge devices are used in such high speed machines. For example, a corona discharge device is used to initially place a charge on the photoreceptor prior to exposure. Corona generating devices are also used prior to the transfer operation to place an appropriate charge on the background so as to prevent or minimize the transfer of background particles. In some machines, corona generating devices are also used to effect the transfer operation. After the transfer operation, corona generating devices are also used to (1) detack the transfer member from the photoreceptor, and (2) to place an appropriate charge on the photoreceptor so as to loosen any residual toner on the photoreceptor so that it may be more easily removed with a brush cleaning apparatus. Thus, as can be seen, corona generating devices are very important to the proper operation of such machines. Many corona generating devices have or must have conductive shields; to keep such corona generating devices operating most effectively, it is highly important that toner be efficiently removed at periodic intervals, because toner accumulations on the shield affect the operation since the shield completes a circuit to the power supply and toner is a dielectric.

In the prior art, various arrangements have been used to remove dirt from such corona generating devices. One method is to pass a high current through the corona wire to burn off any dirt on the wire. While this may remove dirt on the wire, it does not remove the dirt from the shield. Another method has been to use a cleaning pad which contacts both the wire and the shield, the pad generally being made of a porous foam material, e.g., foam urethane. It has been found that pads made of these foam materials do not effectively remove the dirt from the shield and the wire, but merely absorb the dirt and transfer it from one location on the wire or shield to another. Consequently, what is needed is an effective cleaner for a corona generating device which will at least remove substantially all of the dirt on both the shield and the wire.

It is also highly desirable that power supplies designed for various corona generating devices be efficiently used. In a corona generating device having a conductive shield, the total current is equal to the shield current (current between corona wire and shield) plus the plate current (current between corona wire and photoreceptor). Although some corona generating devices may utilize shields which are constructed entirely of a dielectric material, a corona generating device utilized for initially charging a photoreceptor must have a conductive shield to operate properly; the shield is included in the complete circuit of the power supply. In such a device, it is desirable that the plate current be as high as possible (approximately 30% of the total current). One way of increasing the plate current and decreasing the shield current is to construct the shield so that the interior thereof opposite the photoreceptor has a dielectric surface that will increase the plate current component and decrease the shield current component by directing some of the upwardly directed corona emissions downwardly toward the photoreceptor. Naturally, this complicates the manufacturing of the shield and increases the cost of the shield.

SUMMARY OF THE INVENTION

The present invention is directed to an improved corona generating device having a mechanism for cleaning both the corona wire and shield, the cleaning mechanism including a cleaner comprised of a material (e.g., a non-woven cloth) impregnated with an abrasive (e.g., flint). To move the cleaner back and forth along the wire and shield, and to decrease the shield current and increase the plate current, a rod made of a suitable dielectric material is connected to the cleaner, the rod being located between the wire and the shield.

DETAILED DESCRIPTION OF THE INVENTION

Figure 1:
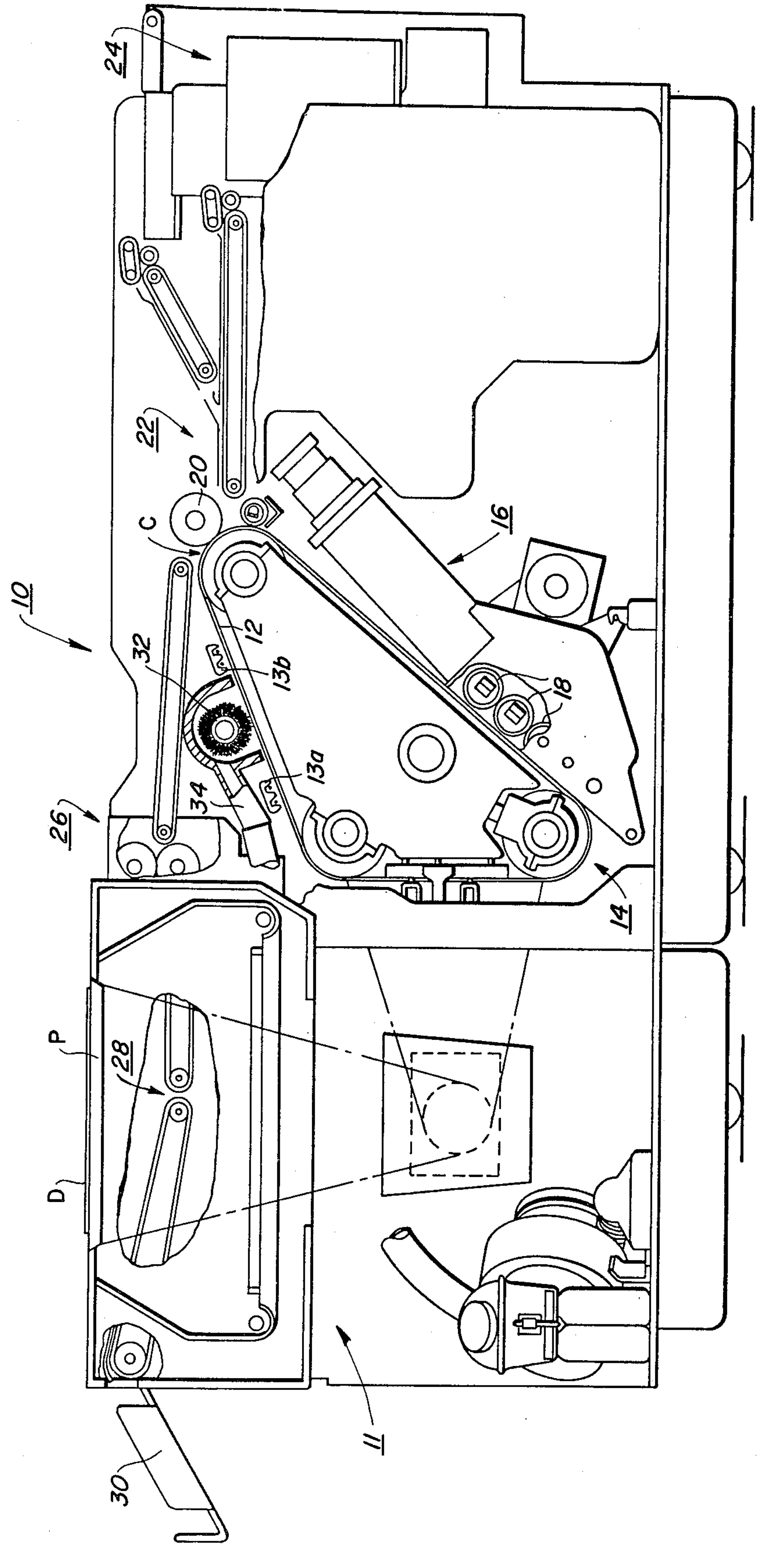
FIG. 1 is a schematic sectional view of an electrostatic reproduction machine embodying the principles of the invention.

For a general understanding of an electrostatic reproduction machine in which the invention may be incorporated, reference is made to FIG. 1 in which the various system components for the machine are schematically illustrated. As in all electrostatic systems of the type illustrated, a light image of a document to be reproduced is projected onto the sensitized surface of a xerographic plate to form an electrostatic latent image thereon. Thereafter, the latent image is developed with an oppositely charged developing material to form a xerographic powder image corresponding to the latent image on the plate surface. The powder image is then electrostatically transferred to a support surface to which it may be fused by a fusing device whereby the powder image is caused to adhere permanently to the support surface.

In the illustrated machine 10, an original document D to be copied is placed upon a transparent support platen P fixedly arranged in an illumination assembly indicated generally by the reference number 11, arranged at the left end of the machine; a platen cover (not shown) is then lowered onto the original D to cover the same. While upon the platen P, an illumination system flashes light rays upon the original thereby producing image rays corresponding to the informational areas of the original. The image rays are projected by means of an optical system for exposing the photosensitive surface of the xerographic plate or photoreceptor in the form of a flexible photoconductive belt 12. The surface of the belt was made photoconductive by the previous step of uniformly charging the same by means of a corona generating device 13. In order to effect image processing, the belt 12 is arranged on a belt assembly indicated generally by the reference numeral 14.

The photoconductive belt assembly 14 is slidably mounted upon two support shafts, one of which is secured to the frame of the machine, and is adapted to drive a belt 12 in the direction of the arrow at a constant rate. During this movement of the belt, the reflected light image of an original on the platen is flashed upon the surface of the belt to produce electrostatic latent images thereon at an exposure station A.

As the belt surface continues its movement, the electrostatic latent image passes through a developing station B in which there is positioned a developer indicated generally by the reference numeral 16. This developer provides development of the electrostatic latent image by magnetic brushes 18.

The developed electrostatic image is then transported by the belt to a transfer station C where a sheet of copy paper is moved between a transfer roller 20 and the belt at a speed synchronism with the moving belt in order to effect transfer of the developed image. There is provided at this station a sheet transport mechanism indicated generally by the numeral 22 which is adapted to transport sheets of paper from a paper handling mechanism indicated generally by the reference numeral 24 to the developed image on the belt at station C.

After the developed image is transferred to the sheet, the latter is stripped from the belt 12 and conveyed into a fuser assembly indicated generally by the reference numeral 26 where the developed and transferred xerographic powder image on the sheet is permanently affixed thereto. After each copy is thus produced, it is delivered via sheet transport mechanism 28 to an output tray 30.

After the image has been transferred at the transfer station C the belt then moves past a corona generating device 32 where the residual background for the residual toner particles are loosened as a result of an appropriate charge being placed on the residual toner by the corona generating device 13*b*. The residual toner may then be more easily removed by a cleaner brush 32 after which the toner is removed by the vacuum duct 34. As stated above, there may be numerous corona generating devices in any given machine, and each of these device needs to be periodically cleaned in order for the device to operate effectively. In the present machine, only two such corona generating devices are illustrated. It is understood, however, that numerous other corona generating devices may be used and the present invention is applicable to any of such devices.

Additional details regarding the subject electrostatic reproduction machine are set forth in a copending U.S. patent application, Ser. No. 312,411, assigned to the same assignee. Although not specifically discussed herein, it is understood that the present invention may also be used in other types of electrostatic copying or duplicating machines, and is not limited to the high speed duplicating machine disclosed herein.

Figure 2:
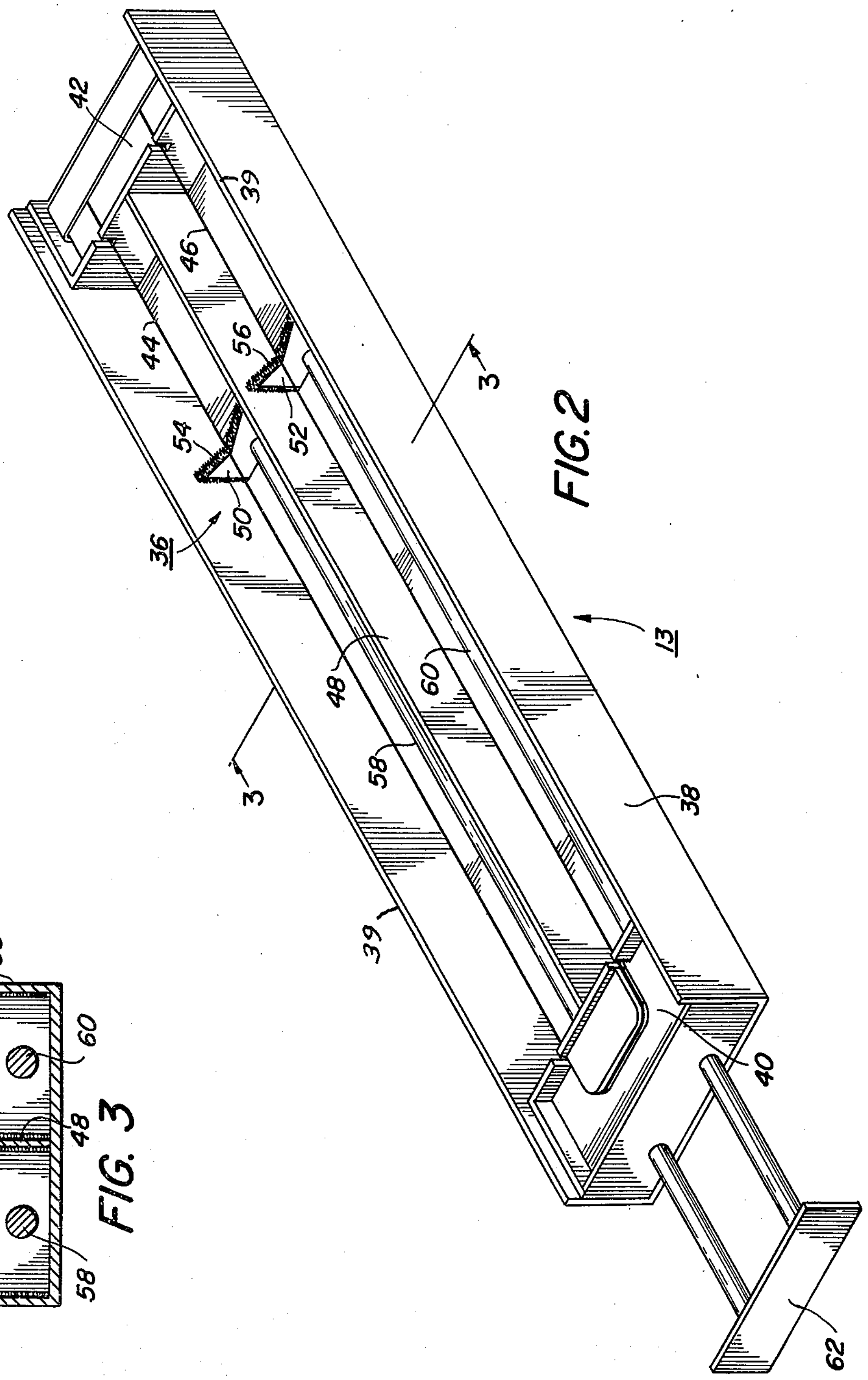
FIG. 2 is an enlarged perspective view of an embodiment of the present invention.
Figure 3:
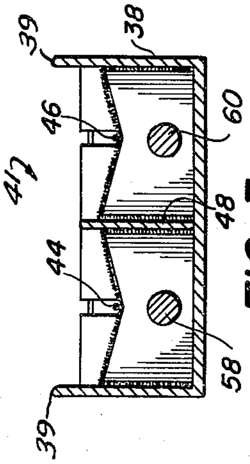
FIG. 3 is a cross-sectional view taken through line 3—3 of FIG. 2 showing the cleaner and the rod.

Referring to FIG. 2, an enlarged perspective view of an embodiment of the present invention is shown. A corona generating device 13 has a cleaning assembly 36. The corona generating device has a generally U-shaped shield 38 made of a conductive material and insulating end blocks 40 and 42 for supporting corona wires or electrodes 44 and 46 within the shield. The shield 38 partially surrounds the corona wires 44 and 46 and a baffle 48 extends between the corona wires. The edges 39 of the shield 38 define a planar discharge opening 41, extending between the edges; it is through this discharge opening that ions travel to the photoconductive belt 12. Suitable connecting means (not shown), such as described in copending U.S. Patent application, Serial No. 136,125 are provided on the end blocks 40 and 42 for connecting the corona wires to a suitable source of voltage. The cleaning assembly 36 is comprised of support plates 50 and 52 mounted within the shield 38 so as to be movable along the length of the latter. The support plates 50 and 52 are sized so as to fit closely within the shield so that when abrasive, cleaning members 54 and 56 are mounted thereto, the latter have an interference fit with the wire and shield. A suitable material for the cleaning members is a non-woven fabric impregnated with an abrasive (e.g., SCOTCH-BRITE Type "F" abrasive cloth manufactured by the 3M Company). Other suitable cleaning members may also be used.

To move the support plates along the length of the shield 38, two rods 58 and 60 are connected to the support plates, the rods extending through openings in one of the end blocks 40. These openings are sized to remove any dirt or toner accumulations on the rods as the latter are moved. A handle 62 is connected to the ends of the rods. Each of the rods is made of a suitable dielectric material (e.g., fiberglass). Although the illustrated rods have a circular cross-section, it is understood that other cross-sections are also suitable, e.g., a square cross-section.

Thus, as can be seen, when it is desired to clean the corona wires 44 and 46 and the internal surface of the shield 38, the operator grasps the handle 62 and moves the support plates 50 and 52 back and forth along the length of the corona shield and corona wires.

It has been found that by utilizing the dielectric or dielectric rods 58 and 60 a much more efficient use can be made of any existing power supply. The dielectric rods serve to partially block current between the corona wires 44 and 46 and the shield surrounding the wires, thus decreasing the shield current and increasing the plate current. Because the rods 58 and 60 are positioned between corona wires 44 and 46 respectively and the bottom of the shield 38, a portion of the ion emissions are thus deflected away from the bottom of the shield and through the opening toward the belt 12. Therefore, the present arrangement provides for a much more efficient use of the power supply.

While the invention has been described with reference to the structure disclosed, it is not confined to the details set forth, but is intended to cover such modifications or changes as may come within the scope of the following claims.

What is claimed is:

1. An improved corona generating device comprising an elongated conductive shield having a generally U-shaped cross section, the elongated edges of the shield defining a planar discharge opening extending between the edges through which ions may be emitted, a corona wire mounted within and extending along the shield parallel to the discharge opening, a cleaning member positioned within the shield in contact with the wire, the improvement comprising means including a dielectric rod for moving the cleaning member along the wire and shield, the rod being (a) positioned between the shield and the wire adjacent the side of the wire which is opposite the discharge opening, and (b) lying in a plane which is perpendicular to the discharge opening and which passes through the wire.

2. An improved corona generating device according to claim 1, wherein the cleaning member is also in contact with the shield.

3. An improved corona generating device according to claim 2, wherein the cleaning member comprises a material impregnated with an abrasive.

4. An improved corona generating device according to claim 3, wherein the abrasive is flint.

* * * * *